(12) United States Patent
Kubota et al.

(10) Patent No.: US 7,265,377 B2
(45) Date of Patent: Sep. 4, 2007

(54) ORGANIC SEMICONDUCTOR DEVICE

(75) Inventors: Makoto Kubota, Kawasaki (JP);
Hajime Miyazaki, Yokohama (JP);
Tomonari Nakayama, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 291 days.

(21) Appl. No.: 10/541,495

(22) PCT Filed: Mar. 31, 2004

(86) PCT No.: PCT/JP2004/004710

§ 371 (c)(1),
(2), (4) Date: Jul. 7, 2005

(87) PCT Pub. No.: WO2004/091001

PCT Pub. Date: Oct. 21, 2004

(65) Prior Publication Data
US 2006/0113523 A1    Jun. 1, 2006

(30) Foreign Application Priority Data

Apr. 1, 2003 (JP) .............................. 2003-098010
Apr. 1, 2003 (JP) .............................. 2003-098086

(51) Int. Cl.
*H01L 29/08* (2006.01)
*H01L 35/24* (2006.01)
*H01L 51/00* (2006.01)

(52) U.S. Cl. ....................................................... 257/40
(58) Field of Classification Search .................... 257/40
See application file for complete search history.

(56) References Cited

U.S. PATENT DOCUMENTS

| 7,026,231 B2 | 4/2006 | Kubota et al. ............... 438/586 |
| 2002/0012083 A1 | 1/2002 | Tanaka et al. ............... 349/106 |
| 2004/0118520 A1 | 6/2004 | Nakayama et al. .... 156/345.41 |
| 2005/0202348 A1 | 9/2005 | Nakayama et al. ......... 430/311 |
| 2005/0287697 A1 | 12/2005 | Unno et al. ................... 438/99 |
| 2006/0081880 A1 | 4/2006 | Miyazaki et al. ........... 257/200 |

FOREIGN PATENT DOCUMENTS

| JP | 9-197386 | 7/1997 |
| JP | 2002-110999 | 4/2002 |

OTHER PUBLICATIONS

Zhenan Bao, et al., "High-Performance Plastic Transistors Fabricated by Printing Techniques", XP-002291916, Chem. Mater., vol. 9, No. 6, 1997, pp. 1299-1301.

*Primary Examiner*—Michael Lebentritt
*Assistant Examiner*—Monica D. Harrison
(74) *Attorney, Agent, or Firm*—Fitzpatrick, Cella, Harper & Scinto

(57) ABSTRACT

An organic semiconductor device that can be driven stably at low gate voltage is provided. The organic semiconductor device of the present invention is characterized by having a silsesquioxane skeleton in an insulating portion.

14 Claims, 9 Drawing Sheets

FIG. 12

| | [Ph]/[Ph]+[Me] | FORMIC ACID | INORGANIC FINE PARTICLES | DRYING TEMPERATURE | FILM THICKNESS | REFRACTIVE INDEX (632nm) | DC20V INSULATION | SOLVENT INSOLUBILITY |
|---|---|---|---|---|---|---|---|---|
| EXAMPLE 10 | 0 | × | × | 190°C | 180nm | 1.388 | ○ | ○ |
| COMP. EXAMPLE 3 | 0 | ○ | × | 100°C | 180nm | 1.411 | × | × |
| EXAMPLE 11 | 0 | ○ | × | 150°C | 171nm | 1.392 | ○ | ○ |
| EXAMPLE 12 | 0 | ○ | × | 200°C | 163nm | 1.382 | ○ | ○ |
| COMP. EXAMPLE 4 | 0.5 | ○ | × | 100°C | 175nm | 1.492 | × | × |
| EXAMPLE 13 | 0.5 | ○ | ○ | 150°C | 160nm | 1.475 | ○ | ○ |
| EXAMPLE 14 | 0 | ○ | ○ | 190°C | 210nm | 1.513 | ○ | ○ |
| COMP. EXAMPLE 5 | OTHER RESINS | × | | 140°C | 250nm | N.D. | × | × |

ORGANIC SEMICONDUCTOR DEVICE

TECHNICAL FIELD

The present invention relates to an organic semiconductor device and a method of manufacturing the same.

BACKGROUND ART

IC technologies using organic semiconductor devices have been drawing attention in recent years. Their major appeals are in that the IC can be manufactured at low costs and flexible resins can be used for a substrate. Because of those advantages, there are great expectations for application of organic semiconductor devices to a circuit that uses a plastic substrate, an electronic tag, a display driver circuit for a display, a memory, etc.

In general, an organic semiconductor device is composed of a substrate, a gate insulating layer, a gate electrode, a source electrode, a drain electrode, and an organic semiconductor layer, and is utilized as a thin film field effect transistor (FET) or the like.

Low molecular weight compounds such as polyacene, π-conjugated system polymer compounds such as polythiophene, and π-conjugated system olygomers are well-known examples of organic compounds that exhibit semiconductor characteristics and are used in devices.

In an organic FET, which is an FET having a semiconductor layer formed from an organic semiconductor, a change in voltage applied to a gate electrode (gate voltage Vg) causes an excess or shortage of electric charges at the interface between a gate insulating layer and an organic semiconductor layer. As a result, a drain-source current (Id), which flows from a source electrode to a drain electrode through the organic semiconductor layer, is changed to make it possible to perform switching.

When building an organic FET on a flexible resin substrate, a gate insulating film, an organic semiconductor layer, and other components on the substrate have to be formed at low temperature. This is to protect the resin substrate, which is weak against high temperature, from softening.

For instance, Bao et al. have proposed an organic TFT manufacturing method in which a polyimide film is formed by screen printing on a polyethylene terephthalate substrate where a gate electrode is previously formed from indium tin oxide, and the polyimide film is then baked at low temperature to obtain an insulating layer (see the article written by Z. Bao, Y. Feng, A. Dodabalapur, V. R. Raju, and A. J. Lovinger on p. 1299 of Chem. Mater. 9, 1997).

To form a gate insulating layer by this method, the gate insulating layer has to be as thick as 200 nm or more. A thick gate insulating layer requires a large gate drive voltage (Vg) of several tens to hundred volts (V).

Japanese Patent Application Laid-Open No. 2002-110999 discloses a method of obtaining a gate insulating layer by spin coating of cyanoethyl pullulan dispersed with barium titanate on a resin substrate in order to reduce Vg. This gate insulating layer is 300 to 500 nm in thickness and is as thick as the one obtained by the method of Bao et al. However, this gate insulating layer which is formed at 120° C. (low temperature) and which is high in dielectric constant makes it possible to drive the resultant organic FET with low voltage. On the other hand, in this type of insulating film, an amorphous compound that serves as the base material (cyanoethyl pullulan in this case) is not completely densified because of the low temperature heat treatment, leaving numerous minute voids in the gate insulating layer. The voids inhibit inorganic compound particles dispersed (barium titanate in this case) from exhibiting their high dielectricity satisfactorily. Compensating the loss of dielectricity with the use of ferroelectric inorganic compound particles such as barium titanate causes remnant polarization and accordingly makes the gate threshold voltage unstable.

There is another problem in that, if the insulating layer is dried in the low heat treatment step in order to lessen the influence of heat over the resin substrate, the insulating layer is dissolved in an organic solvent in the subsequent step of forming an organic semiconductor layer and an electrode.

As described above, the prior art techniques of forming a gate insulating film at low temperature are incapable of giving satisfactory device performance and the resultant organic semiconductor devices have been found to be undesirable.

DISCLOSURE OF THE INVENTION

The present invention has been made to solve the above problems, and an object of the present invention is therefore to form an insulating film to serve as a gate insulating layer on a resin substrate through a simple step such as printing or spin coating and through low temperature heat treatment.

Another object of the present invention is to provide an organic semiconductor device which can be driven with low voltage and has stable drive voltage by the use of the above insulating film, and a method of manufacturing the organic semiconductor device.

Therefore, the present invention provides an organic semiconductor device having an electrode for bias application, comprising: a substrate, an organic semiconductor, an insulator, and a conductor, characterized in that at least one compound constituting the insulator has a silsesquioxane skeleton of the Formula 1.

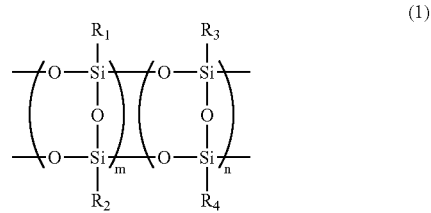

(In the formula, $R_1$, $R_2$, $R_3$, and $R_4$ each represent one of a substituted or unsubstituted alkyl group having 1 to 5 carbon atoms and a substituted or unsubstituted phenyl group, and $R_1$, $R_2$, $R_3$, and $R_4$ may be the same functional group or functional groups different from one another. m and n each represent an integer of 0 or more, and the sum of m and n is an integer of 1 or more. The skeleton may be of a random copolymer or a block copolymer.)

According to an aspect of the present invention, an organic semiconductor device comprises a substrate, an organic semiconductor, a gate insulator, a gate electrode, a source electrode, and a drain electrode, and is characterized in that:

(1) at least one compound constituting the gate insulator has a silsesquioxane skeleton shown in Chemical Formula 1, (2) the gate insulator has a thickness of 50 nm or more and 250 nm or less, (3) the gate insulator is formed by a coating step and a drying step of a precursor solution, and (4) the refractive index of the gate insulator at a wavelength of 632 nm after the drying step is reduced by 0.015 or more from that before the drying step.

According to the present invention, an organic semiconductor device is provided in which electric characteristics are changed stably at low voltage.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 12 is a table showing manufacture conditions and characteristics of insulating thin films obtained in Examples 10 through 14 of the present invention to be applied to an organic semiconductor device of the present invention, and manufacture conditions and characteristics of thin films obtained in Comparative Examples 3 through 5.

BEST MODE FOR CARRYING OUT THE INVENTION

Figure 1:
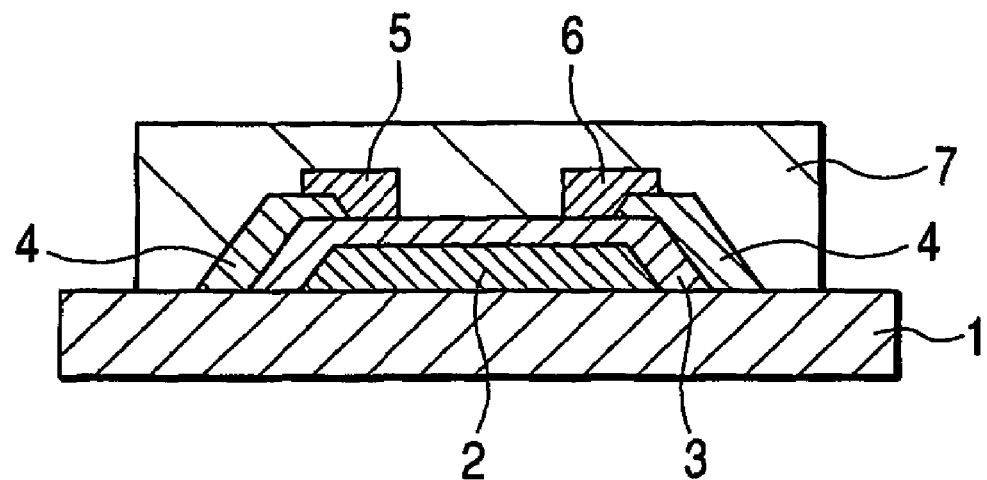
FIG. 1 is a schematic vertical sectional view showing an enlarged view of a part of an organic semiconductor device which is composed of a substrate, a gate electrode, a gate insulating layer, a device partitioning insulating layer, a source electrode, a drain electrode, and an organic semiconductor layer in accordance with an embodiment of the present invention.

Preferred embodiments of the present invention will now be described in detail in accordance with the accompanying drawings.

According to the present invention, the following (A) to (K) are obtained:

(A) an organic semiconductor device having an electrode for bias application comprising a substrate, an organic semiconductor; an insulator, and a conductor, characterized in that at least one compound constituting the insulator has a silsesquioxane skeleton of the Formula 1.

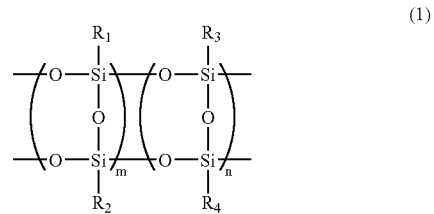

(1)

(In the formula, $R_1$, $R_2$, $R_3$, and $R_4$ each represent one of a substituted or unsubstituted alkyl group having 1 to 5 carbon atoms and a substituted or unsubstituted phenyl group, and $R_1$, $R_2$, $R_3$, and $R_4$ may be the same functional group or functional groups different from one another. m and n each represent an integer of 0 or more, and the sum of m and n is an integer of 1 or more. The skeleton may be of a random copolymer or a block copolymer.);

(B) an organic semiconductor device according to (A), characterized in that the conductor of the organic semiconductor device includes a gate electrode, a source electrode, and a drain electrode, the insulator comprises a gate insulating layer, and at least one compound constituting the gate insulating layer has the silsesquioxane skeleton of the Formula 1;

(C) an organic semiconductor device according to (B), characterized in that the gate insulating layer has a thickness of 50 nm or more and 250 nm or less;

(D) a method of manufacturing an organic semiconductor device, characterized by including the steps of: coating a substrate with a solution containing at least one of polyorganosilsesquioxane compounds of the Formula 2 and/or the Formula 3; and drying the solution at a temperature of 200° C. or lower to form the insulator in the organic semiconductor device according to any one of (A) to (C).

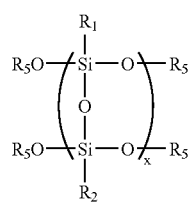
(2)

(In the formula, $R_1$ and $R_2$ each represent one of a substituted or unsubstituted alkyl group having 1 to 5 carbon atoms and a substituted or unsubstituted phenyl group, and $R_1$ and $R_2$ may be the same functional group. $R_5$ represents one of an alkyl group having 1 to 4 carbon atoms and a hydrogen atom, and x is an integer of 1 or more.)

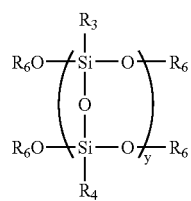
(3)

(In the formula, $R_3$ and $R_4$ each represent one of a substituted or unsubstituted alkyl group having 1 to 5 carbon atoms and a substituted or unsubstituted phenyl group, and $R_3$ and $R_4$ may be the same functional group. $R_6$ represents one of an alkyl group having 1 to 4 carbon atoms and a hydrogen atom, and y is an integer of 1 or more.);

(E) a method of manufacturing an organic semiconductor device according to (D), characterized in that the solution containing the polyorganosilsesquioxane compound further contains formic acid;

(F) an organic semiconductor device according to (A), further including: a substrate, a gate insulating layer, a gate electrode; a source electrode; a drain electrode, and an organic semiconductor layer, characterized in that the gate insulating layer contains a compound having a silsesquioxane skeleton of the Formula 1 and an inorganic compound particle which is dispersed into the compound and does not have ferroelectricity of a relative dielectric constant of 5 or more;

(G) an organic semiconductor device according to (F), characterized in that the gate insulating layer has a thickness of 50 nm or more and 250 nm or less;

(H) a method of manufacturing an organic semiconductor device, characterized by including: coating a substrate with a dispersion prepared by dispersing an inorganic compound particle having no ferroelectricity into a solution containing at least one of polyorganosilsesquioxane compounds of the Formula 2 and/or the Formula 3; and drying the dispersion at a temperature of 200° C. or lower to form the gate insulating layer of the organic semiconductor device according to (F) or (G);

(I) a method of manufacturing an organic semiconductor device according to (H), characterized in that the solution containing the polyorganosilsesquioxane compound further contains formic acid;

(J) an organic semiconductor device comprising a substrate, an organic semiconductor, a gate insulator, a gate electrode; a source electrode, and a drain electrode, characterized in that:

(1) at least one compound constituting the gate insulator has a silsesquioxane skeleton of the Formula 1;

(2) the gate insulator has a thickness of 50 nm or more and 250 nm or less;

(3) the gate insulator is formed by a coating step and a drying step of a precursor solution; and (4) the refractive index of the gate insulator at a wavelength of 632 nm after the drying step is reduced by 0.015 or more from that before the drying step.

(K) an organic semiconductor apparatus formed by the organic semiconductor device according to any one of (A) to (C), (F), (G), and (J).

A detailed description of the present invention will be given below through an embodiment.

An organic semiconductor device according to this embodiment is a device that has at least an organic semiconductor, an insulator, and a conductor. The insulator is an insulating film (layer) for covering the conductor, which serves as an electrode. The organic semiconductor is an organic semiconductor layer that responds to stimulation (an electric field) by the conductor (electrode), specifically, a layer that changes its electric characteristics in response to electric field. More specifically, the organic semiconductor is an organic semiconductor layer whose conductivity, in other words, the amount of current flowing, is changed in response to a change in electric field.

The insulating layer is not only for electrically insulating the organic semiconductor layer and the conductor which serves as the electrode from each other when the electrode controls electric characteristics of the organic semiconductor layer but also for inducing positive or negative electric charges in the interface between the insulating layer and the organic semiconductor.

In addition to the three components, the organic semiconductor device may have a source electrode and a drain electrode. In this case, the conductor can be used as a gate electrode and the insulating layer can be used as a gate insulating layer for covering the gate electrode in order to insulate the gate electrode from the organic semiconductor layer, the source electrode, and the drain electrode. The thus structured device can serve as a thin film transistor (TFT) called a thin film field effect transistor (FET).

The present inventors have paid attention on the insulating layer material since as mentioned above, the insulating layer according to this embodiment is not only for electrically insulating the organic semiconductor layer and the conductor which serves as the electrode from each other when the electrode controls electric characteristics of the organic semiconductor layer but also for inducing positive or negative electric charges in the interface between the insulating layer and the organic semiconductor.

The insulating layer material is described below.

The present inventors have made an extensive study on molecules in search of a material that can provide a thin, dense insulating layer from low temperature process to find out that a material having a specific siloxane structure is the one that meets the requirement. The material having the specific siloxane structure has an inorganic siloxane unit as a principal chain and a substituent having carbon as a side chain. In other words, the material is of an organic-inorganic hybrid, ladder-type silsesquioxane skeleton. With this material as the main ingredient of a film, the film can be formed at low temperature while obtaining high density. Such film has been found to exert satisfactory insulating ability even at a thickness equal to or less than 250 nm, and the present invention thus has been completed. The term "ladder type" is a common term for one that has only a few branches. Being of a ladder type, the thin film has fewer voids inside than a film of a non-ladder type silsesquioxane skeleton, and therefore is high in density and insulating ability.

Substituents $R_1$ to $R_4$ having carbon correspond to side chains of the silsesquioxane skeleton according to the present invention each represent a substituted or unsubstituted alkyl group of 1 to 5 carbon atoms or a substituted or unsubstituted phenyl group. The substituents $R_1$ to $R_4$ may be the same functional groups or different functional groups depending on locations. Examples thereof include: an unsubstituted alkyl group such as a methyl group or ethyl group; a substituted alkyl group such as a methoxy group, an ethoxy group, or a methoxyethyl group; an unsubstituted phenyl group; and a substituted phenyl group such as a dimethylphenyl group or a naphthyl group. In addition to carbon atoms and hydrogen atoms, the substituents $R_1$ to $R_4$ may contain various atoms such as oxygen atoms, nitrogen atoms, and metal atoms. However, a substituent containing a halogen atom is not desirable as the substituents $R_1$ to $R_4$ since it lowers the insulating ability.

Chemical Formula 1 explains the silsesquioxane skeleton according to the present invention, and shows a structural formula in which a silsesquioxane unit having the substituents $R_1$ and $R_2$ (hereinafter referred to as first unit) being repeated m times and a silsesquioxane unit having the substituents $R_3$ and $R_4$ (hereinafter referred to as second unit) being repeated n times are connected (m and n each represents an integer equal to or larger than 0 and m+n is an integer equal to or larger than 1). This does not mean the repeated first units and the repeated second units are always separated from each other. The two types of units are connected to each other while sorted by the type or while mixed with each other in a random manner.

Given next is a more detailed description on the structure of an organic field effect transistor (organic TFT), which is one of the organic semiconductor device according to this embodiment.

FIG. 1 is a schematic vertical sectional view of the organic semiconductor device according to this embodiment. Reference numeral 1 denotes a substrate, 2, a gate electrode, 3, an insulating layer, 4, a device partitioning insulating layer, 5, a source electrode, 6, a drain electrode, and 7, an organic semiconductor layer. The device has the gate electrode 2 on a surface of the substrate 1, and the gate insulating layer 3 is formed on the gate electrode 2. The source electrode 5 and the drain electrode 6 are placed with a spacing therebetween on a surface of the insulating layer 3. The organic semiconductor layer 7 is placed on the source electrode 5 and the drain electrode 6 and on a region of the insulating layer 3 that is between the electrodes 5 and 6 in a manner that brings the organic semiconductor layer 7 into contact with the electrodes 5 and 6.

The insulating layer 3 covers the gate electrode 2. The device partitioning insulating layer 4 covers both sides of the insulating layer 3. A portion of the source electrode 5 is on the device partitioning insulating layer 4 whereas another portion of the electrode 5 is on the insulating layer 3, and the same applies to the drain electrode 6. The insulating layer according to the present invention (in other words, a layer of an insulating material which has a silsesquioxane skeleton) refers to the insulating layer 3 or the device partitioning insulating layer 4. However, the insulating layer can be any insulating portion that constitutes an organic semiconductor device. It is also possible to use the insulating layer of the present invention for both the insulating layer 3 and the device partitioning insulating layer 4. The device partitioning insulating layer 4 in this embodiment is provided to keep the organic semiconductor layer 7 from coming into contact with the gate insulating layer 3 except for the region between the electrodes 5 and 6. If formed from the material of silsesquioxane skeleton, the device partitioning insulating layer 4 obtains satisfactory insulating ability even when it is thin and makes it possible to lessen a level difference, which causes defective electric contact, and to reduce the device in size. The device partitioning insulating layer 4 and the insulating layer 3 may be formed from different materials.

The organic semiconductor layer 7 in this embodiment is arranged to cover all of the insulating layer 3 which covers the gate electrode 2, the device partitioning insulating layer 4 which is on each side of the insulating layer 3, the source electrode 5, and the drain electrode 6.

Figure 2:
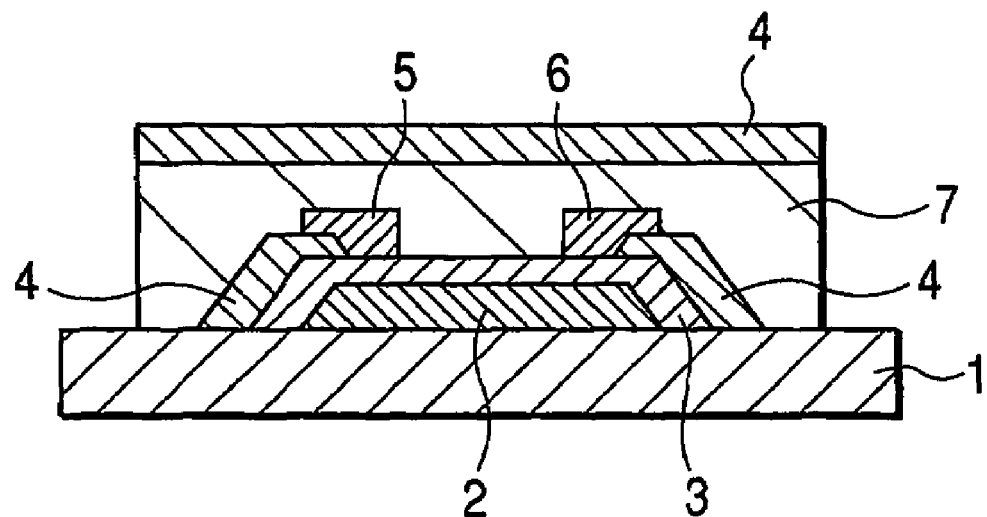
FIG. 2 is a schematic vertical sectional view showing an enlarged view of a part of an organic semiconductor device which is composed of a substrate, a gate electrode, a gate insulating layer, a device partitioning insulating layer, a source electrode, a drain electrode, and an organic semiconductor layer in accordance with an embodiment of the present invention.

A structure shown in FIG. 2 is also preferable. In FIG. 2, another device partitioning insulating layer 4 is placed on the organic semiconductor layer 7. This device partitioning insulating layer and the one arranged on each side of the insulating layer 3 are denoted by the same reference numeral, 4, since the two layers share the same purpose, which is to electrically insulate the organic semiconductor layer 7 from every part of the device except the region between the electrodes 5 and 6. These three partitioning insulating layers 4 may be connected to or cut from one another. The three device partitioning insulating layers may be formed from the same material or different materials.

An insulating material can be used to form the substrate 1 according to this embodiment. Specific examples of the substrate material include inorganic materials such as glass and sintered alumina, and various insulating resin films such as a polyimide film, a polyester film, a polyethylene film, a polyphenylene sulfide film, and a polyparaxylene film. When the substrate is formed of resin, the resultant organic semiconductor device is light-weight and flexible.

In the case the above-described insulating film is used as the insulating layer 3 in this embodiment, the thickness of the insulating layer 3 is preferably set to 50 nm or more and 250 nm or less. Given the silsesquioxane skeleton, the gate insulating layer 3 is densified and improved in insulating ability of the thin film. If the thickness of the insulating layer 3 is set smaller than 50 nm, the insulating layer 3 may fail to obtain satisfactory insulating ability against a gate voltage applied upon driving the organic semiconductor device. On the other hand, if the thickness of the insulating layer 3 is set thicker than 250 nm, the device operates properly, but such insulating layer 3 may present an obstacle in making the organic semiconductor device small enough to achieve high degree of device integration and, in addition, may increase the gate drive voltage (Vg).

To achieve even lower gate drive voltage (Vg) and even higher insulating ability at the same time, a more desirable thickness for the insulating layer 3 is 70 nm or more and 170 nm or less.

When the insulating layer 3 does not have a level surface in terms of device design, the distance between an interface where a channel is formed and the gate electrode is taken as the substantial thickness of the insulating layer 3.

In this embodiment, the insulating film having the silsesquioxane skeleton may contain inorganic compound fine particles. With inorganic compound fine particles contained in the insulating film, the gate drive voltage (Vg) of the organic semiconductor device can be reduced even more.

It is preferable to employ inorganic compound fine particles that have a relative dielectric constant of 5 or more in order to reduce the gate voltage (Vg). Thus the gate drive voltage (Vg) is lowered by inorganic compound fine particles that have a given relative dielectric constant or more. The inorganic compound is preferably a dielectric substance that is not ferroelectric in order to prevent the gate insulating layer from developing remnant polarization characteristics.

Also, an electroconductive inorganic compound should be avoided, so that the insulating ability of the gate insulating layer 3 is not impaired.

From these points of view, examples of inorganic compound fine particles that can be employed in this embodiment include aluminum oxide ($Al_2O_3$), titanium dioxide ($TiO_2$), ditantalum pentoxide ($Ta_2O_5$), cerium oxide ($CeO_2$), zirconium oxide ($ZrO_2$), magnesium oxide (MgO), strontium titanate (STO), and barium strontium titanate (BST). Note that employable inorganic compound fine particles are not limited to the examples listed above.

Only one type of inorganic compound fine particles may be chosen or different types may be used in combination.

Inorganic compound fine particles employed can have any shape as long as they can be dispersed well in the main ingredient.

The mean particle size of inorganic compound fine particles per se before dispersion is preferably 3 nm or more and 140 nm or less. If the mean particle size is smaller than 3 nm, the effect of improving the dielectric constant throughout the gate insulating layer is lost no matter how large an amount of inorganic compound fine particles are dispersed in the insulating layer of silsesquioxane skeleton. On the other hand, if the mean particle size is larger than 140 nm, the inorganic compound fine particles are dispersed poorly in the insulating layer of silsesquioxane skeleton and the total thickness of the insulating layer may exceed 250 nm.

The insulating layer 3 is formed by applying a solution of a silsesquioxane compound expressed by Chemical Formula 2 and/or Chemical Formula 3 to the substrate and then dried.

Chemical Formula 2 and Chemical Formula 3 have different substituent structures and therefore their skeleton example is shown in a drawing.

Heating can be employed to apply and dry the silsesquioxane compound solution. Once the solution is dried, a film is obtained. The heating temperature can be set low (200° C. or lower). Heating induces a hydrolysis reaction at terminals of the compound to bond the silsesquioxane compound which is the raw material in a ladder-like manner and change the compound into a high molecular weight silsesquioxane compound. At this point, the compound does not reach the silica structure where substituents containing carbon, which serve as side chains of the compound, are oxidized and completely burnt off. Instead, the compound forms the silsesquioxane skeleton which maintains most of the substituents containing carbon. This state can be observed by elemental analysis on carbon components or other methods.

If the coat is dried at a temperature higher than 200° C., the coat shrinks greatly and the insulating ability is rather impaired. In addition, the substrate could be softened, degraded, or damaged by heating at a temperature over 200° C. in the case where a resin-based substrate material is employed. A more desirable drying temperature is 180° C. or lower and this widens choices of the resin substrate applicable to the organic semiconductor device of the present invention.

The lower limit of the drying temperature for drying the coat is not particularly fixed but is determined in accordance with the type of the compound that constitutes the gate insulating film. If the drying temperature is set too low, the hydrolysis reaction is not induced and the film fails to obtain the insulating ability or, even when the film obtains the insulating ability, the film is insufficiently densified to be dissolved in an organic solvent in the subsequent step. In short, the lower limit of the drying temperature in the present invention is a lower limit temperature at which the insulating film can obtain both insulating ability and resistance to an organic solvent.

Figure 3:
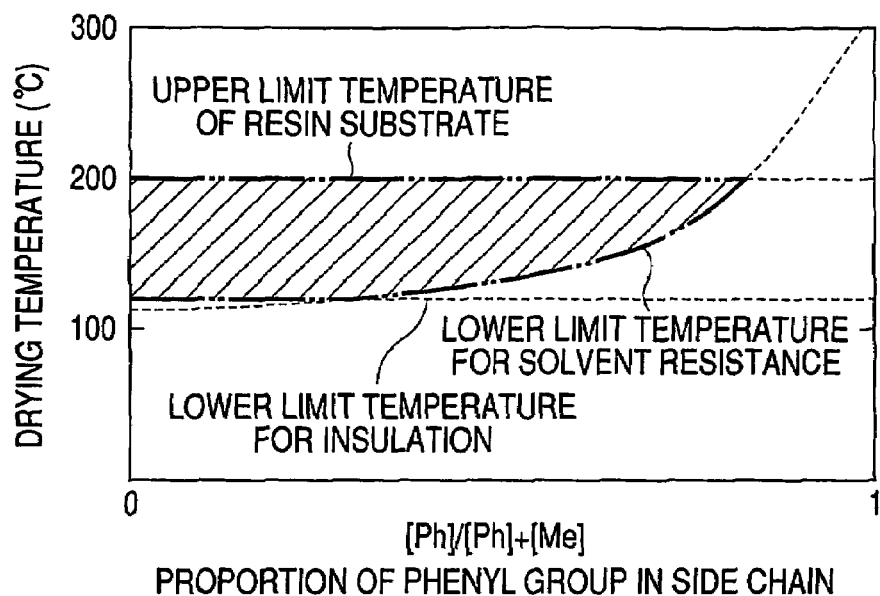
FIG. 3 is a graph to illustrate the concept of the present invention by an example in which a gate insulating layer is formed by application of a compound that is expressed by Chemical Formula 2 with its $R_1$ and $R_2$ both representing methyl groups and by Chemical Formula 3 with its $R_3$ and $R_4$ both representing phenyl groups.

An example is given by way of a concept diagram of FIG. 3 which shows the correlation between the drying temperature and the proportion of phenyl groups in silsesquioxane side chains in a gate insulating layer that is formed from a certain compound system. The gate insulating layer in the graph is formed by application of a material expressed by Chemical Formula 2 with its $R_1$ and $R_2$ both representing methyl groups and by Chemical Formula 3 with its $R_3$ and $R_4$ both representing phenyl groups. The axis of abscissa of the graph shows the proportion of phenyl groups in the side chains, [Ph]/[Ph]+[Me], and the insulating film has a silsesquioxane skeleton in which left ends are all methyl groups and right ends are all phenyl groups. The axis of ordinate of the graph shows the film drying temperature (centigrade). A preferable insulating film is obtained by confining the drying temperature to a hatched portion surrounded by three lines indicative of an upper limit temperature at which a resin substrate is not adversely affected (here, 200° C.), a lower limit temperature at which the film can obtain the insulating ability, and a lower limit temperature at which the film exhibits insolubility to an organic solvent. The lower end of the hatched portion corresponds to the lower limit of the drying temperature.

The gate insulating layer 3 of the organic semiconductor device in this embodiment preferably decreases its refractive index at a wavelength of 632 nm by 0.015 or more through the drying step for forming the gate insulating layer 3.

The refractive index of a thin film can readily be measured by a commercially available spectroscopic ellipsometer, spectral reflectance thickness monitor, or the like. In general, the refractive index varies depending on the wavelength. The refractive index in the present invention refers to one at 632 nm, which is the wavelength of a He—Ne laser, unless otherwise stated.

As the silsesquioxane compound is bonded through the drying step thereby densifying the film, the total refractive index of the film is reduced. In other words, an insulating film that does not much decrease its refractive index through the drying step may be insufficient in insulating ability and solvent resistance.

A small amount of acid such as formic acid may be added to the solution to be applied in order to assist a cross-linking reaction of an organosilsesquioxane compound upon drying.

The amount of acid added is not particularly limited. The addition amount of formic acid that accelerates the cross-linking reaction is 1 wt % to 30 wt % in relation to the weight of the solid component of the polyorganosilsesquioxane compound in the application solution.

If the amount of formic acid added is smaller than 1 wt %, the effect of accelerating the cross-linking reaction is not sufficient enough whereas the insulating ability of the film after the drying is impaired if the addition amount exceeds 30 wt %.

Since the cross-linking reaction and removal of the solvent take place at low temperature (200° C. or lower), a stabilizing agent which does not evaporate voltalize, or burn out in this temperature range should be removed from the solvent system as much as possible.

The stabilizing agent is a compound added to prevent a hydrolysis reaction while a silsesquioxane compound contained in a solvent system in an oligomer state is stored. The insulating film according to this embodiment also presents a manufactural advantage of having no need to deal with the stabilizing agent which is originally contained in the liquid to be applied, in other words, having no need to perform special refinement treatment on a commercially available raw material to use the material as an application liquid.

In the case where the gate insulating layer 3 is to contain inorganic compound particles, the inorganic compound particles are dispersed in advance in a solution of a polyorganosilsesquioxane compound expressed by Chemical Formula 2 and/or Chemical Formula 3. The solution is then applied to the substrate and dried to obtain the gate insulating layer 3. In this case also, addition of acid to the solution helps the cross-linking reaction.

The application solution can have any solvent such as alcohols and esters. When inorganic compound particles are used, a suitable solvent is chosen taking into account the dispersibility of the particles. The wettability with respect to the substrate is also considered in selecting a solvent.

How the application solution is to be applied is not particularly limited. Generally usable coating methods, for example, spin coating, casting, spray coating, the doctor blade method, dye coating, dipping, printing, and ink jet may be employed. Of those methods, spin coating, dipping, spray coating, and ink jet are preferable from the viewpoint of forming a film of desired thickness by controlling the amount to be applied.

Any material can be used to form the gate electrode 2, the source electrode 5, and the drain electrode 6 according to the present invention as long as the electrodes can be formed on a resin substrate at low temperature. For instance, an organic material such as polyaniline or polythiophene, or a precursor material such as electroconductive ink is employed. Such electrode materials can be formed into electrodes by application, which is a simple electrode formation process. Inorganic materials also can be used as electrode materials, and examples thereof include gold, platinum, chromium, palladium, aluminum, indium, molybdenum, nickel and like other metals, alloys of those metals, polysilicon, amorphous silicon, tin oxide, indium oxide, and indium tin oxide (ITO). Those inorganic materials can be formed into electrodes by the known photolithography method. The electrode material is not limited to those listed above. Two or more kinds of materials selected from the above may be employed at the same time, or at least one kind selected from the above organic materials may be used in combination with at least one kind selected from the inorganic materials listed in the above.

The organic semiconductor layer 7 in the present invention is desirably formed from an aromatic compound, a chain compound, an organic pigment, an organic silicon compound, or the like of a π electron conjugated system. Specific examples thereof include pentacene, a pentacene derivative having a bicylo ring introduced between central benzene rings, tetracene, anthracene, a thiophene oligomer derivative, a phenylene derivative, a phthalocyanine derivative, a polyacetylene derivative, a polythiophene derivative, and cyanine dye. The material of the layer 7 is not limited to those known organic semiconductor layer materials.

Various thin film forming methods such as deposition, application, and solution accretion can be employed to form the organic semiconductor layer 7. In order to reduce influence on a resin substrate, a process that requires lower temperature, for example, 200° C. or lower is preferred. In other words, the upper limit temperature for forming the organic semiconductor layer 7 is determined by first taking thermal influence on a resin substrate into cosideration.

Thereafter, a protective layer may be formed to protect a surface of the device, which in this embodiment has the insulating layer 4 on the organic semiconductor layer 7. In other words, the device surface covered with the protective layer is a surface of the insulating layer 4 on the organic semiconductor layer 7 in this embodiment. With the protective layer, the device can be protected from steam and active gas.

The protective layer can be formed from various inorganic materials or insulative organic materials.

The organic semiconductor device according to the present invention can be formed on a resin substrate through a low temperature process with ease, and therefore its transistor characteristics can be utilized actively in application to various devices such as a switching element unit for controlling ON and OFF of each pixel in an IC information electronic tag or an active matrix display device.

Specifics of the present invention will be described below through Examples, but the present invention is not limited to those Examples.

(Insulating Layer Evaluation)

EXAMPLE 1

Commercially available methyl silsesquioxane (MSQ) flakes (GR650, a product of SHOWA DENKO K. K.) were dissolved in a solvent obtained by mixing ethanol and butanol at a weight ratio of 1:1, thereby preparing a solution of 5 wt % concentration.

The prepared application solution was applied by spin coating (at 5000 rpm) to a silicon substrate on which a gold electrode was formed by deposition in advance. The coat was dried on a hot plate at 200° C. for 30 minutes to obtain a thin film.

Figure 4:
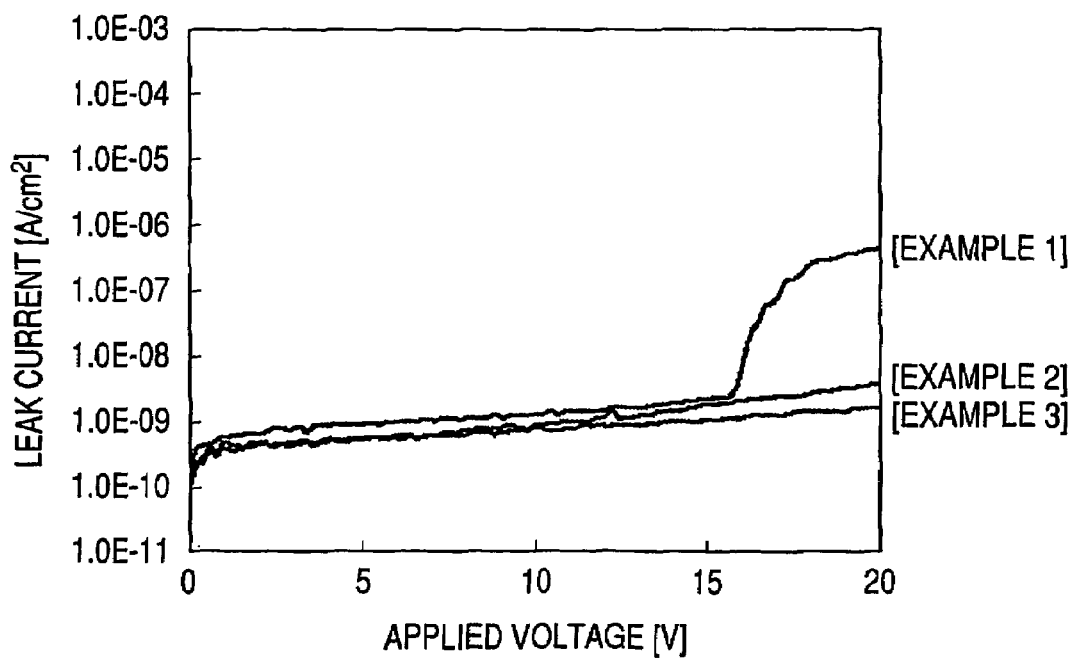
FIG. 4 is a graph showing electric characteristics of an insulating thin film in Examples 1, 2, and, 3 of the present invention.

The obtained thin film measured about 160 nm in thickness according to a stylus profilometer. A gold electrode was formed by deposition on a surface of the obtained thin film to measure the dielectric constant by an LCR meter. The relative dielectric constant was stable in a measurement range of 10 to 20 kHz and measured about 3.8 at 1 kHz. A microammeter was used to investigate insulating characteristics of the film. The results are shown in FIG. 4. The axis of abscissa of FIG. 4 shows the direct voltage applied to the film and the axis of ordinate shows a leak current observed. It is understood from the results that the obtained thin film exhibited high insulating ability in a voltage range of 0 to 14 V.

EXAMPLE 2

Commercially available phenyl silsesquioxane (PSQ) flakes (GR950, a product of SHOWA DENKO K. K.) were dissolved in a solvent obtained by mixing ethanol and butanol at a weight ratio of 1:1, thereby preparing a solution of 7 wt % concentration.

The prepared application solution was applied by the method employed in Example 1 to a substrate with a gold electrode. The coat was dried on a hot plate at 180° C. for 60 minutes to form a thin film.

The obtained thin film measured about 140 nm in thickness according to a stylus profilometer. The relative dielectric constant of the obtained film was stable in a measurement range of 10 to 20 kHz and measured about 4.6 at 1 kHz. The film was also measured for leak current. The results are shown in FIG. 4. It is understood from the results that the obtained thin film exhibited high insulating ability in a voltage range of 0 to 20 V.

EXAMPLE 3

MSQ and PSQ at a weight ratio of 3:7 were dissolved in a solvent obtained by mixing ethanol and butanol at a weight ratio of 1:1, thereby preparing a solution of 7 wt % concentration.

The prepared application solution was applied by the method employed in Example 1 to a substrate with a gold electrode. The coat was dried on a hot plate at 200° C. for 40 minutes to form a thin film.

The obtained thin film measured about 155 nm in thickness according to a stylus profilometer. The relative dielectric constant of the obtained film was stable in a measurement range of 10 to 20 kHz and measured about 4.3 at 1 kHz. The film was also measured for leak current. The results are shown in FIG. 4. It is understood from the results that the obtained thin film exhibited high insulating ability in a voltage range of 0 to 20 V.

EXAMPLE 4

MSQ flakes were dissolved in a solvent obtained by mixing ethanol and butanol at a weight ratio of 1:1, thereby preparing a solution of 5 wt % concentration. Formic acid was added to the prepared solution at a weight ratio of 15:1 in relation to MSQ in order to accelerate a cross-linking reaction caused by hydrolysis.

The prepared application solution was applied by the method employed in Example 1 to a substrate with a gold electrode. The coat was dried on a hot plate at 160° C. for 30 minutes to obtain a thin film.

The obtained thin film measured about 140 nm in thickness. The obtained thin film exhibited high insulating ability in a direct voltage range of 0 to 20 V. The relative dielectric constant was stable in a measurement range of 10 to 10 kHz and measured about 4.0 at 1 kHz.

EXAMPLE 5

MSQ flakes, strontium titanate (STO) particles (a product of SAKAI CHEMICAL INDUSTRY CO., LTD, mean particle size: 100 nm), and polyvinyl pyrrolidone (a product of Wako Pure Chemical Industries, Ltd.) were mixed at a weight ratio of 2:10:1. The mixture was dissolved in a solvent obtained by mixing butanol and vinyl acetate at a weight ratio of 1:1 to prepare a solution of 7 wt % concentration. Formic acid was added to the prepared solution at a weight ratio of 10:1 in relation to MSQ.

The prepared application solution was applied by the method employed in Example 1 to a substrate with a gold electrode. The coat was dried on a hot plate at 180° C. for 2 hours to obtain a thin film.

The obtained thin film measured about 190 nm in thickness. The obtained thin film exhibited high insulating ability in a direct voltage range of 0 to 15 V. The relative dielectric constant was stable in a measurement range of 10 to 10 kHz and measured about 50 at 1 kHz.

COMPARATIVE EXAMPLE 1

For comparison to the samples prepared in accordance with the present invention, insulating films obtained by dispersing ferroelectric particles in a common amorphous insulator were produced and put up for evaluation.

Cyanoethyl pullulan (a product of Shin-Etsu Chemical Co., Ltd), barium titanate particles (a Product of SAKAI CHEMICAL INDUSTRY CO., LTD, mean particle size: 100 nm), and polyvinyl pyrrolidone (a product of Wako Pure Chemical Industries, Ltd.) were mixed at a weight ratio of 2:8:1. The mixture was dissolved in N,N-dimethyl formaldehyde to prepare solutions of various concentrations (5 to 30 wt %).

Each of the prepared application solution was applied by spin coating to a silicon substrate on which a gold electrode was formed by deposition in advance. The coat was dried on a hot plate at 140° C. for 24 hours to obtain various thin films different in thicknesses.

The films were measured by a microammeter to investigate the relation between the film thickness and insulating characteristics. It is understood from the results of the investigation that the insulating ability was obtained in a direct voltage range of 0 to 10 V only when the film thickness was larger than 400 nm but no serviceable insulating film was obtained at a thickness smaller than 250 nm.

The relative dielectric constant of the insulating film having a thickness of 500 nm was about 60 at 1 kHz.

(Forming an Organic Semiconductor Device)

EXAMPLE 6

Figure 5A:
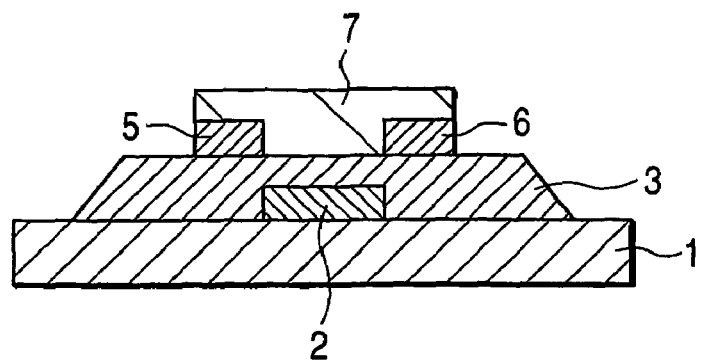
FIGS. 5A and 5B are a schematic vertical sectional view and a schematic plan view, respectively, showing an enlarged view of a part of an organic semiconductor device structure in accordance with Examples 6, 7, and 8 of the present invention, the organic semiconductor device structure being composed of a substrate, a gate electrode, a gate insulating layer, a source electrode, a drain electrode, and an organic semiconductor layer.
Figure 5B:
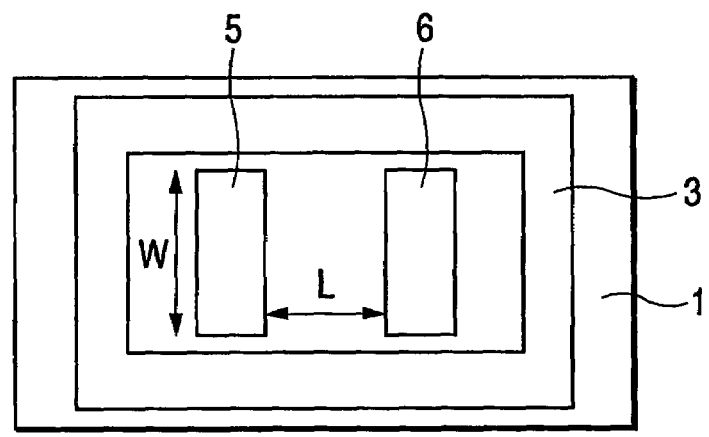

FIGS. 5A and 5B are schematic diagrams showing an organic semiconductor device according to Example 6 of the present invention. FIG. 5A is a sectional view of the organic semiconductor device and FIG. 5B is a plan view of the organic semiconductor device. Reference numeral 1 denotes a resin substrate made of polyimide, 2, a gate electrode, 3, a gate insulating layer according to the present invention, 5, a source electrode, 6, a drain electrode, and 7, an organic semiconductor layer formed of pentacene.

First, the gate electrode 2 was formed on a surface of the substrate 1 by vacuum deposition with the use of a metal deposition mask. The electrode material was aluminum. The ultimate vacuum for the deposition was $3 \times 10^{-5}$ Pa. The substrate temperature was set to room temperature.

Subsequently, a thin film was formed on the gate electrode 2 in a manner similar to Example 1. To elaborate, the gate insulating layer 3 having a methylsilsesquioxane skeleton was formed to a thickness of about 160 nm.

Then a metal deposition mask was used to form the source electrode 5 and the drain electrode 6 by vacuum deposition. The electrode material was gold. The ultimate vacuum for the deposition was $3 \times 10^{-5}$ Pa. The substrate temperature was set to room temperature. The distance L between the source electrode and the drain electrode was set to 0.1 mm and the length W of the source and drain electrodes was set to 30 mm. The gold deposition film had a thickness of 100 nm.

The organic semiconductor layer 7 was formed by vacuum deposition of pentacene on the gate insulating layer 3, the source electrode 5, and the drain electrode 6. The raw material of the layer 7, i.e., pentacene powder, was obtained by refining commercially available powder through sublimation. The ultimate vacuum in an deposition device chamber was 3 to 5×10$^{-4}$ Pa. The pentacene film had a thickness of 180 nm and was not patterned.

An organic semiconductor device of the present invention was thus completed.

Figure 7:
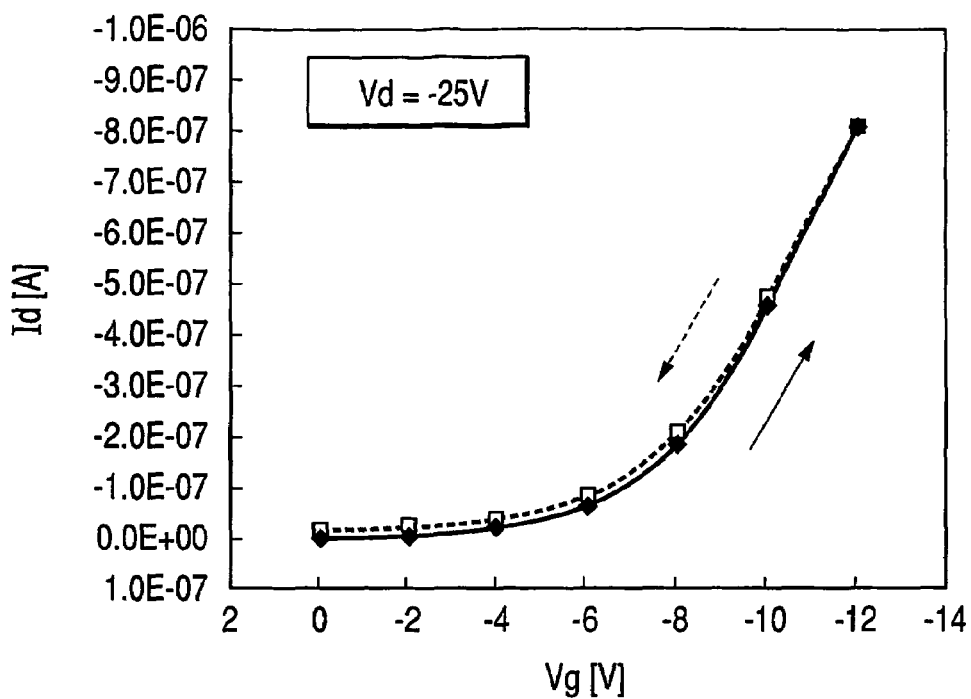
FIG. 7 is a graph showing TFT characteristics of an organic semiconductor device in Example 6 of the present invention.

The Vg-Id curve of the obtained organic semiconductor device was measured by 4156C (a product of Agilent Technologies) and results shown in FIG. 7 were obtained. The drain voltage Vd at this point was −25 V.

In FIG. 7, the organic semiconductor device of this embodiment showed switching characteristics in which a drain current (Id) flowing among the source electrode, the organic semiconductor, and the drain electrode changed with a change in a gate voltage (Vg). The organic semiconductor device achieved an on/off ratio of 10$^4$ of Id with Vg set to −12 V.

EXAMPLE 7

An organic semiconductor device structured as shown in FIGS. 5A and 5B was manufactured in a manner similar to Example 6 except that a PSQ thin film equivalent to the one in Example 2 was used as the gate insulating layer 3.

The organic semiconductor device exhibited switching characteristics in which a drain current (Id) changed with a change in a gate voltage (Vg), and an on/off ratio of 10$^4$ of Id was achieved with Vg set to −9 V.

EXAMPLE 8

An organic semiconductor device structured as shown in FIGS. 5A and 5B was manufactured in a manner similar to Example 6 except that a MSQ/PSQ mixed thin film equivalent to the one in Example 3 was used as the gate insulating layer 3.

The organic semiconductor device exhibited switching characteristics in which a drain current (Id) changed with a change in a gate voltage (Vg), and an on/off ratio of 10$^4$ of Id was achieved with Vg set to −10 V.

EXAMPLE 9

Figure 6:
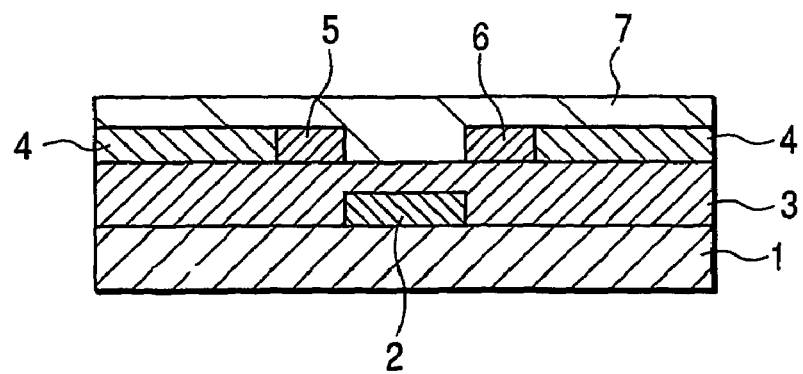
FIG. 6 is a schematic vertical sectional view showing an enlarged view of a part of an organic semiconductor device structure in accordance with Example 9 and Comparative Example 2 of the present invention, the organic semiconductor device structure being composed of a substrate, a gate electrode, a gate insulating layer, a source electrode, a drain electrode, and an organic semiconductor layer.

FIG. 6 is a schematic sectional view showing an organic semiconductor device according to Example 9 of the present invention. Reference numeral 1 denotes a resin substrate made of polyimide, 2, a gate electrode, 3, a gate insulating layer according to the present invention, 5, a source electrode, 6, a drain electrode, and 7, an organic semiconductor layer formed of pentacene.

A thin film was formed in a manner similar to Example 5 on the resin substrate 1 having the gate electrode 2 which was used in Example 6. In other words, the gate insulating layer 3 composed of a compound in which MSQ was cross-linked and STO particles which were dispersed in the compound was formed to a thickness of about 190 nm.

An application solution identical to the one used in Example 1 was applied by spin coating (5000 rpm) to the gate insulating layer 3. The coat was dried on a hot plate at 180° C. for 30 minutes to form the device partitioning insulating layer 4. The device partitioning insulating layer 4 was selectively formed only in necessary locations by the lift-off method utilizing a photoresist, a technique known to the skilled in the art. The necessary locations here refer to portions where the gate insulating layer 3 has to be kept from coming into contact with other electroconductive portions or semiconductor portions.

Then the source electrode 5, the drain electrode 6, and the organic semiconductor layer 7 were formed in a manner similar to Example 6 to thereby complete the organic semiconductor device.

Figure 8:
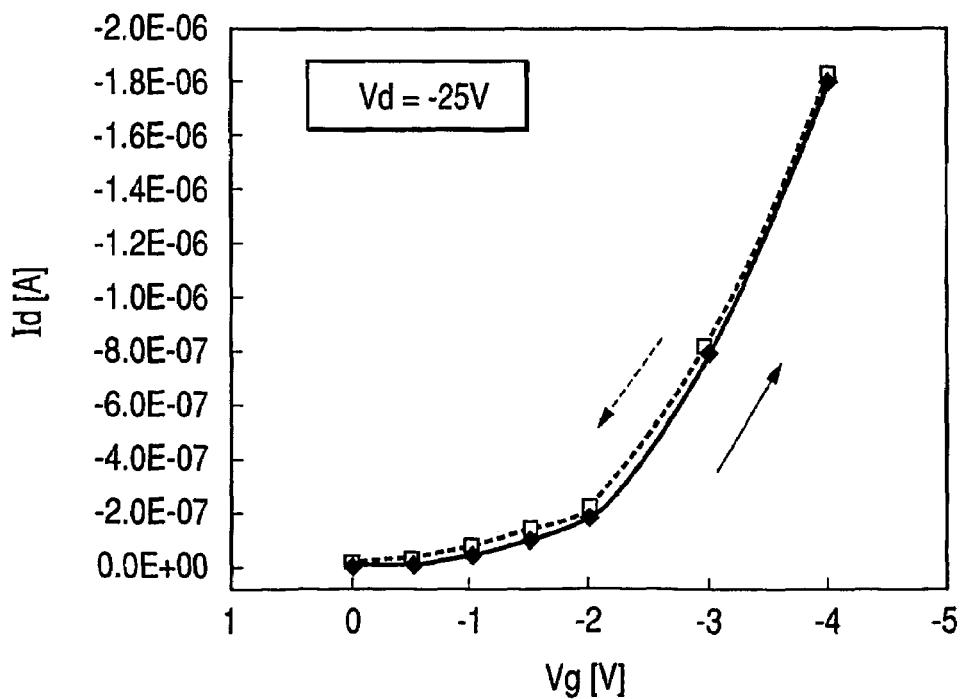
FIG. 8 is a graph showing TFT characteristics of an organic semiconductor device in Example 9 of the present invention.

The Vg-Id curve of the obtained organic semiconductor device was measured and results shown in FIG. 8 were obtained (Vd=−25 V). The organic semiconductor device exhibited switching characteristics in which a drain current (Id) changed with a change in a gate voltage (Vg). The organic semiconductor device achieved an on/off ratio of 10$^5$ of Id with Vg set to −4 V.

COMPARATIVE EXAMPLE 2

For comparison to the samples prepared in accordance with the present invention, an organic semiconductor device having the insulating film of Comparative Example 1 as the gate insulating layer 3 was manufactured.

This device had a structure identical to that of Example 9 except that the gate insulating layer of this device was the 500 nm thick insulating film of Comparative Example 1.

Figure 9:
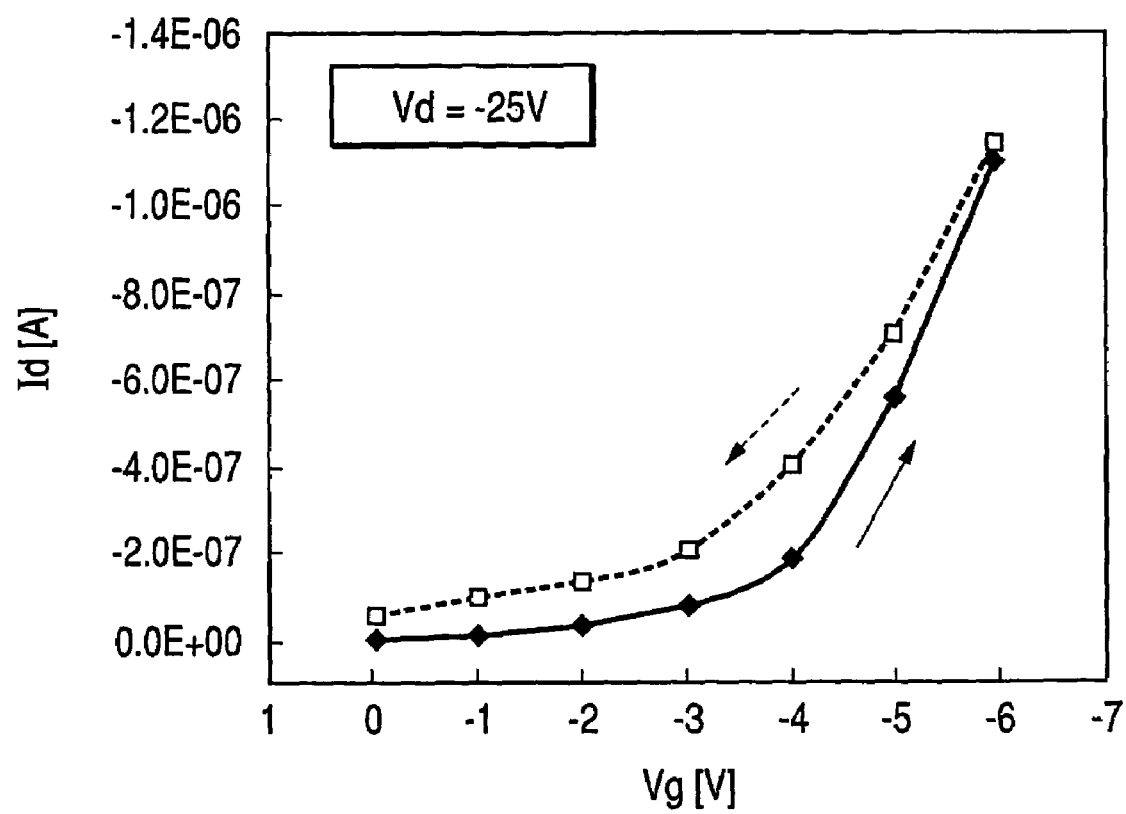
FIG. 9 is a graph showing TFT characteristics of an organic semiconductor device in Comparative Example 2 of the present invention.

The Vg-Id curve of the obtained organic semiconductor device was measured and results shown in FIG. 9 were obtained (Vd=−25 V). It is understood from the graph that the organic semiconductor device achieved an on/off ratio of 10$^5$ of Id with Vg set to −6 V but showed different switching characteristics upon rise and fall of Vg.

The behavior is probably due to the ferroelectric characteristics of barium titanate used to increase the dielectric constant and has an adverse effect on stable operation of the device.

(Embodiments for Measuring Refractive Index)

(Gate Insulating Layer Evaluation)

EXAMPLE 10

Commercially available methyl silsesquioxane (MSQ) flakes (GR650, a product of SHOWA DENKO K. K.) were dissolved in a solvent obtained by mixing ethanol and butanol at a weight ratio of 1:1, thereby preparing a solution of 7 wt % concentration.

The prepared application solution was applied by spin coating (at 5000 rpm) to a silicon substrate on which a gold electrode was formed by deposition in advance. The coat in this state had the solvent of the application solution remaining therein and therefore was pre-dried on a hot plate at 100° C. for 5 minutes. Then the coat was measured for refractive index at a wavelength of 632 nm by a spectral reflectance thickness monitor (a product of Otsuka Electronics Co., Ltd.), and the refractive index measured was 1.420.

The coat was subsequently dried on a hot plate at 190° C. for 20 minutes to obtain an insulating thin film for use in an organic semiconductor device of the present invention.

The film was measured for the thickness and the refractive index at a wavelength of 632 nm by the spectral reflectance thickness monitor. The thickness and refractive index measured were 180 nm and 1.388, respectively. The refractive index of the film was therefore reduced through the drying step by 0.022.

Figure 10:
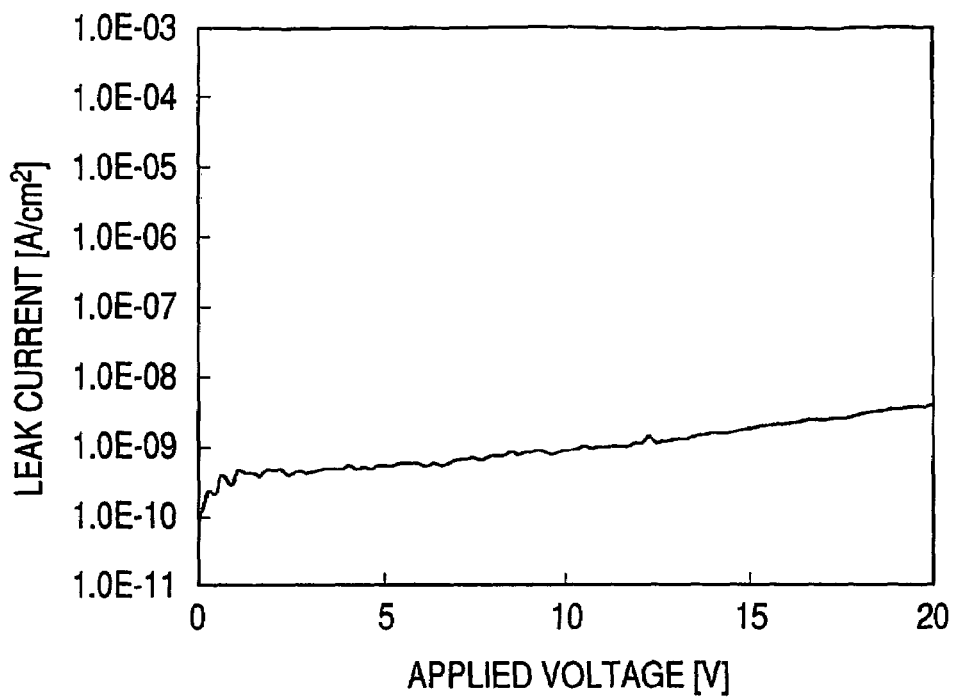
FIG. 10 is a graph showing electric characteristics of an insulating thin film in Example 10 of the present invention.

A microammeter was used to investigate insulating characteristics of the film. The results are shown in FIG. 10. The axis of abscissa of FIG. 10 shows the direct voltage applied to the film and the axis of ordinate shows a leak current observed. It is understood from the results that the obtained thin film exhibited high insulating ability in a voltage range of 0 to 20 V.

A substrate with the obtained insulating thin film was immersed in five different organic solvents, butanol, hexane, methyl ethyl ketone, ethyl acetate, and toluene, for 5 minutes and then the solvents were dried in order to test the resistance of the thin film to an organic solvent. As a result, the film did not show any change in appearance or thickness irrespective of the solvent type.

EXAMPLE 11

MSQ flakes were dissolved in a solvent obtained by mixing ethanol and butanol at a weight ratio of 1:1, thereby preparing a solution of 10 wt % concentration. Formic acid was added to the prepared solution at a weight ratio of 12:1 in relation to MSQ in order to accelerate a cross-linking reaction caused by hydrolysis.

The prepared application solution was applied to a silicon substrate having a gold electrode in a manner similar to Example 10. The coat was pre-dried on a hot plate at 100° C. for 5 minutes to measure the refractive index at a wavelength of 632 nm. The refractive index measured was 1.416.

The coat was subsequently dried on a hot plate at 150° C. for 20 minutes to obtain an insulating thin film for use in an organic semiconductor device of the present invention.

The thickness and refractive index measured were 171 nm and 1.392, respectively. The refractive index of the film was therefore reduced through the drying step by 0.024.

Figure 11:
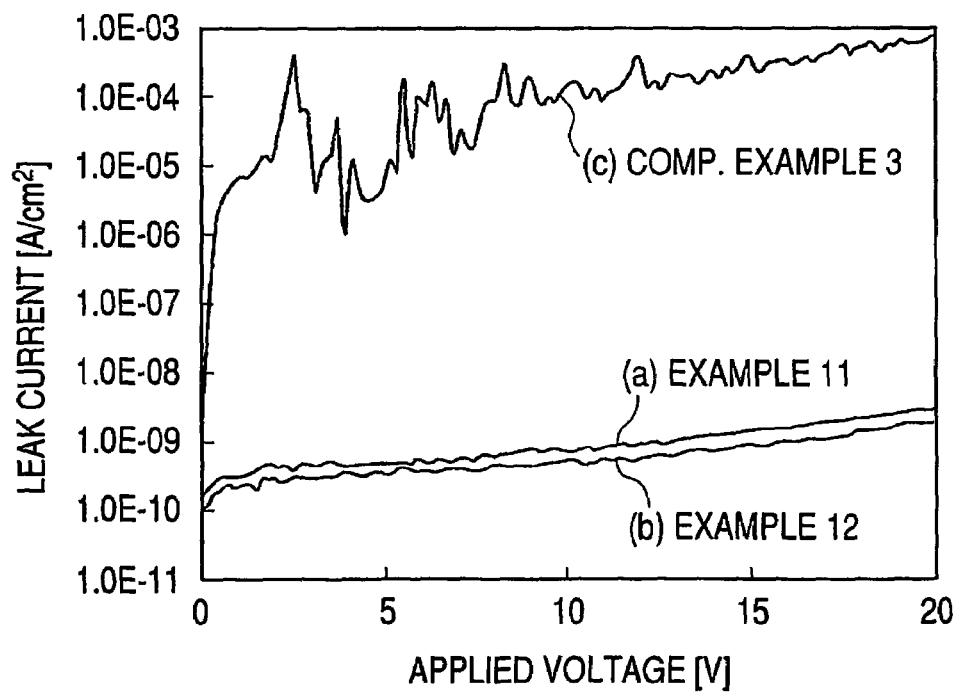
FIG. 11 is a graph showing electric characteristics of insulating thin films in Examples 11 and 12 of the present invention and electric characteristics of a thin film in Comparative Example 3.

A microammeter was used to investigate insulating characteristics of the film. The results are shown in FIG. 11 with line (a). The axis of abscissa of FIG. 11 shows the direct voltage applied to the film and the axis of ordinate shows a leak current observed. It is understood from the results that the obtained thin film exhibited high insulating ability in a voltage range of 0 to 20 V.

The film was subjected to the organic solvent resistance test described in Example 10. As a result, the film did not show any change in appearance or thickness irrespective of the solvent type.

EXAMPLE 12

An insulating thin film for use in an organic semiconductor device of the present invention was obtained in a manner similar to Example 11 except that the drying temperature was changed to 200° C.

The thickness and refractive index measured were 163 nm and 1.382, respectively. The refractive index of the film was therefore reduced through the drying step by 0.034.

A microammeter was used to investigate insulating characteristics of the film. The results are shown in FIG. 11 with line (b) It is understood from the results that the obtained thin film exhibited high insulating ability in a voltage range of 0 to 20 V.

The film was subjected to the organic solvent resistance test described in Example 10. As a result, the film did not show any change in appearance or thickness irrespective of the solvent type.

COMPARATIVE EXAMPLE 3

An application solution identical to the one used in Example 11 was applied in the same manner to a substrate having a gold electrode. The coat was pre-dried on a hot plate at 100° C. for 5 minutes to measure the refractive index at a wavelength of 632 nm. The refractive index measured was 1.416.

The coat was subsequently dried on a hot plate at 100° C. for 30 minutes.

The thickness and refractive index measured were 180 nm and 1.411, respectively. The refractive index of the film was therefore reduced through the drying step by 0.005.

A microammeter was used to investigate insulating characteristics of the film. The results are shown in FIG. 11 with line (c). It is understood form the results that the obtained thin film did not exhibit sufficiently high insulating ability in a voltage range of 0 to 20 V.

The film was also subjected to the organic solvent resistance test of Example 10, with the result that the thin film dissolved in four of the organic solvents, hexane, methyl ethyl ketone, ethyl acetate, and toluene, and disappeared.

EXAMPLE 13

MSQ and commercially available phenyl silsesquioxane (PSQ) flakes (GR950, a product of SHOWA DENKO K. K.) at a weight of 1:1 were dissolved in a solvent obtained by mixing ethanol and butanol at a weight ratio of 1:1, thereby preparing a solution of 7 wt % concentration.

The prepared application solution was applied to a substrate having a gold electrode in a manner similar to Example 10. The coat was pre-dried on a hot plate at 100° C. for 5 minutes to measure the refractive index at a wavelength of 632 nm. The refractive index measured was 1.494.

The coat was subsequently dried on a hot plate at 150° C. for 20 minutes to obtain an insulating thin film for use in an organic semiconductor device of the present invention. The thickness and refractive index measured were 160 nm and 1.475, respectively. The refractive index of the film was therefore reduced through the drying step by 0.019.

The obtained thin film exhibited high insulating ability in a voltage range of 0 to 20 V.

The film was subjected to the organic solvent resistance test described in Example 10. As a result, the film did not show any change in appearance or thickness irrespective of the solvent type.

COMPARATIVE EXAMPLE 4

An application solution identical to the one used in Example 13 was applied in the same manner to a substrate having a gold electrode. The coat was pre-dried on a hot plate at 100° C. for 5 minutes to measure the refractive index at a wavelength of 632 nm. The refractive index measured was 1.494.

The coat was subsequently dried on a hot plate at 100° C. for 30 minutes to obtain an insulating thin film for use in an organic semiconductor device of the present invention.

The thickness and refractive index measured were 175 nm and 1.492, respectively. The refractive index of the film was therefore reduced through the drying step by 0.002.

The obtained thin film lost its insulating ability at a voltage of 4 V or higher and had a current leakage equal to or more than 0.01 A/cm$^2$.

The film was also subjected to the organic solvent resistance test of Example 10, with the result that the thin film dissolved in each organic solvent and disappeared.

EXAMPLE 14

MSQ flakes, strontium titanate (STO) particles (a product of SAKAI CHEMICAL INDUSTRY CO., LTD, mean particle size: 100 nm), and polyvinyl pyrrolidone (a product of Wako Pure Chemical Industries, Ltd.) were mixed at a weight ratio of 2:10:1. The mixture was dissolved in a solvent obtained by mixing butanol and vinyl acetate at a weight ratio of 1:1 to prepare a solution of 7 wt % concentration. Formic acid was added to the prepared solution at a weight ratio of 10:1 in relation to MSQ.

The prepared application solution was applied to a substrate having a gold electrode in a manner similar to Example 10. The coat was pre-dried on a hot plate at 100° C. for 5 minutes to measure the refractive index at a wavelength of 632 nm. The refractive index measured was 1.533.

The coat was subsequently dried on a hot plate at 190° C. for 120 minutes to obtain an insulating thin film for use in an organic semiconductor device of the present invention.

The thickness and refractive index measured were 210 nm and 1.513, respectively. The refractive index of the film was therefore reduced through the drying step by 0.020.

The obtained thin film exhibited high insulating ability in a voltage range of 0 to 20 V.

The film was subjected to the organic solvent resistance test described in Example 10. As a result, the film did not show any change in appearance or thickness irrespective of the solvent type.

COMPARATIVE EXAMPLE 5

For comparison to the samples prepared in accordance with the present invention, insulating films obtained by dispersing ferroelectric particles in a common amorphous insulator were prepared and put up for evaluation.

Cyanoethyl pullulan (a product of Shin-Etsu Chemical Co., Ltd.), barium titanate particles (a product of SAKAI CHEMICAL INDUSTRY CO., LTD, mean particle size: 100 nm), and polyvinyl pyrrolidone (a product of Wako Pure Chemical Industries, Ltd.) were mixed at a weight ratio of 2:8:1. The mixture was dissolved in N,N-dimethyl formaldehyde to prepare solutions of various concentrations (5 to 30 wt %).

Each of the prepared application solution was applied by spin coating to a silicon substrate on which a gold electrode was formed by deposition in advance. The coat was dried on a hot plate at 140° C. for 24 hours to obtain various thin films in different thicknesses.

The films were measured by a microammeter to investigate the relation between the film thickness and insulating characteristics. According to the investigation, the insulating ability was obtained in a direct voltage range of 0 to 10 V only when the film thickness was larger than 400 nm but no serviceable insulating film was obtained at a thickness smaller than 250 nm.

The film was also subjected to the organic solvent resistance test of Example 10, with the result that the thin film dissolved in four of the organic solvents, hexane, methyl ethyl ketone, ethyl acetate, and toluene, and partially disappeared.

Manufacture conditions and characteristics of the insulating thin films obtained in Examples 10 through 14 to be applied to an organic semiconductor device of the present invention and manufacture conditions and characteristics of the thin films obtained in Comparative Examples 3 through 5 are tabularized in FIG. 12.

(Forming an Organic Semiconductor Device)

EXAMPLE 15

Figure 13A:
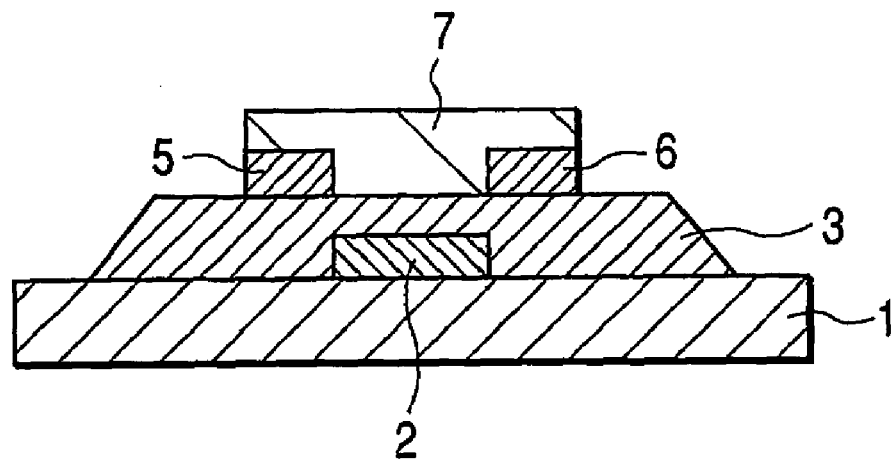
FIGS. 13A and 13B are a schematic vertical sectional view and a schematic plan view, respectively, showing an enlarged view of a part of an organic semiconductor device structure in accordance with Example 15 of the present invention, the organic semiconductor device structure being composed of a substrate, a gate electrode, a gate insulating layer, a source electrode, a drain electrode, and an organic semiconductor layer.
Figure 13B:
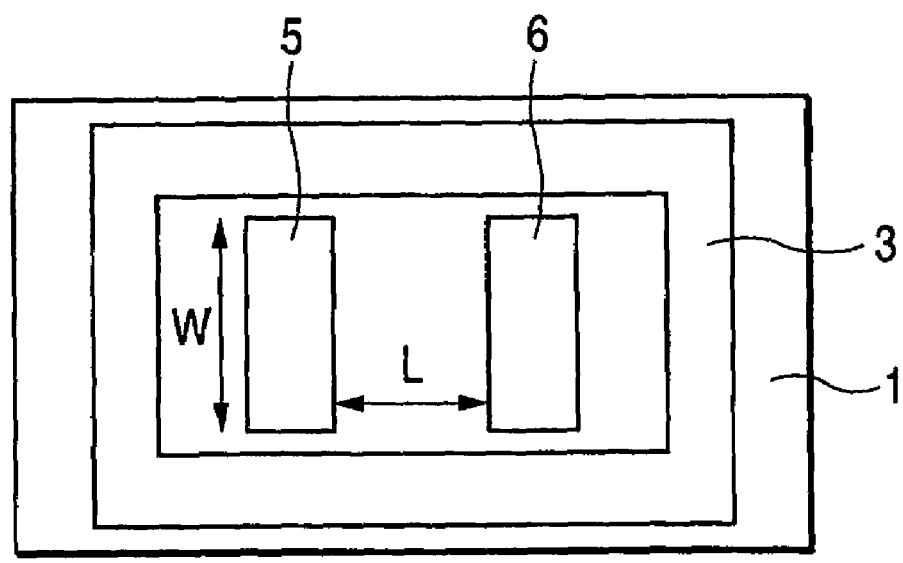

FIGS. 13A and 13B are schematic diagrams showing an organic semiconductor device according to Example 15 of the present invention. FIG. 13A is a sectional view of the organic semiconductor device and FIG. 13B is a plan view of the organic semiconductor device. Reference numeral 1 denotes a resin substrate made of polyimide, 2, a gate electrode, 3, a gate insulating layer according to the present invention, 5, a source electrode, 6, a drain electrode, and 7, an organic semiconductor layer formed of pentacene.

First, the gate electrode 2 was formed on a surface of the substrate 1 by vacuum deposition with the use of a metal deposition mask. The electrode material was aluminum. The ultimate vacuum for the deposition was 3×10$^{-5}$ Pa. The substrate temperature was set to room temperature.

Subsequently, a thin film was formed on the gate electrode 2 in a manner similar to Example 11. To elaborate, the gate insulating layer 3 having a methylsilsesquioxane skeleton was formed to a thickness of 171 nm. The reduction of the refractive index at a wavelength of 632 nm through the drying step at 150° C. was 0.024 on this substrate too.

Then, a metal deposition mask was used to form the source electrode 5 and the drain electrode 6 by vacuum deposition. The electrode material was gold. The ultimate vacuum for the deposition was 3×10$^{-5}$ Pa. The substrate temperature was set to room temperature. The distance L between the source electrode and the drain electrode was set to 0.1 mm and the length W of each of the source and drain electrodes was set to 30 mm. The gold deposition film had a thickness of 100 nm.

The organic semiconductor layer 7 was formed by vacuum deposition of pentacene on the gate insulating layer 3, the source electrode 5, and the drain electrode 6. The raw material of the layer, i.e., pentacene powder, was obtained by refining commercially available powder through sublimation. The ultimate vacuum in an deposition device chamber was 3 to 5×10$^{-4}$ Pa. The pentacene film had a thickness of 180 nm and was not patterned.

An organic semiconductor device of the present invention was thus completed.

Figure 14:
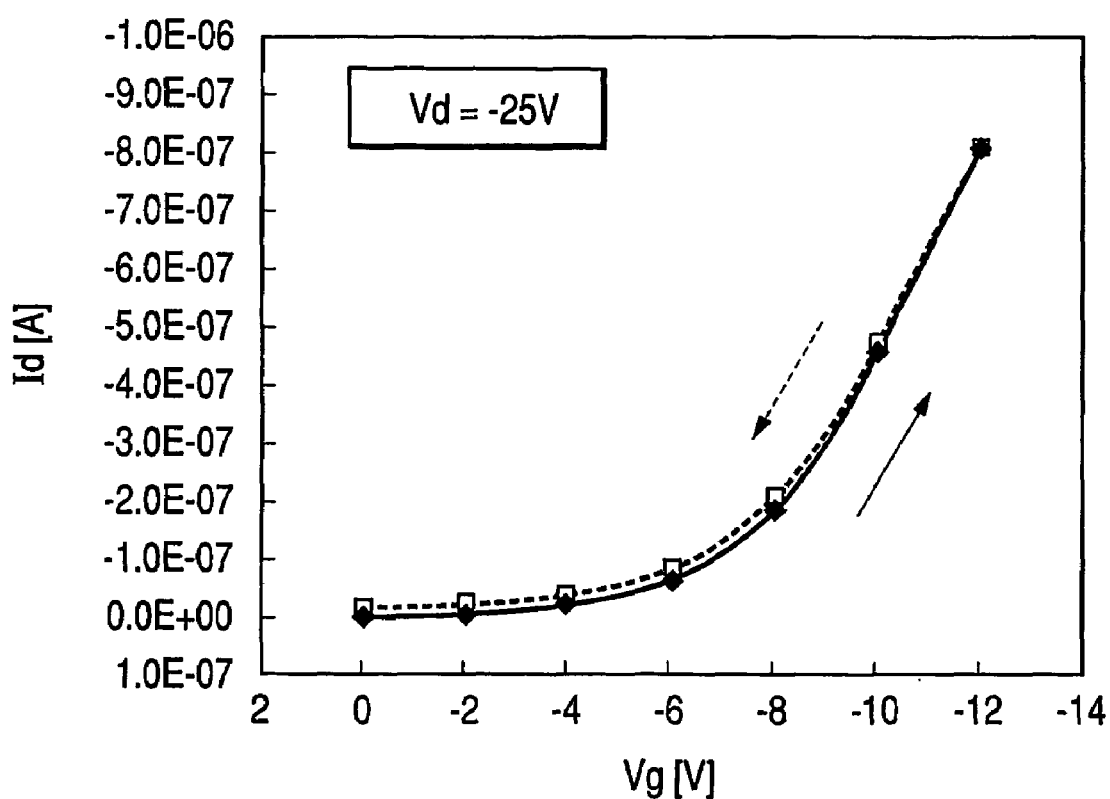
FIG. 14 is a graph showing TFT characteristics of an organic semiconductor device in Example 15 of the present invention.

The Vg-Id curve of the obtained organic semiconductor device was measured by 4156C (a product of Agilent Technologies) and results shown in FIG. 14 were obtained. The drain voltage Vd at this point was −25 V.

It is understood from the graph that the organic semiconductor device of this embodiment exhibited switching characteristics in which a drain current (Id) flowing among the source electrode, the organic semiconductor, and the drain electrode changed with a change in a gate voltage (Vg). The organic semiconductor device achieved an on/off ratio of $10^4$ of Id with Vg set to −12 V.

As has been described in the above Examples, an insulating film which is to serve as a gate insulating layer and which has high solvent resistance can be formed on a resin substrate through a simple process such as printing or spin coating and low temperature heat treatment.

With the above insulating film, an organic semiconductor device that can be driven on low drive voltage is obtained as well as a method of manufacturing the organic semiconductor device.

The present invention is not limited to the above embodiments and various changes and modifications can be made within the spirit and scope of the present invention. Therefore to apprise the public of the scope of the present invention, the following claims are made.

The invention claimed is:

1. An organic semiconductor device having an electrode for bias application, comprising: a substrate, an organic semiconductor, an insulator; and a conductor, wherein at least one compound constituting the insulator has a silsesquioxane skeleton of the Formula 1:

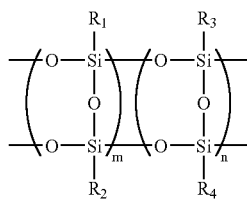

(1)

where $R_1$, $R_2$, $R_3$, and $R_4$ each represent one of a substituted or unsubstituted alkyl group having 1 to 5 carbon atoms and a substituted or unsubstituted phenyl group, and $R_1$, $R_2$, $R_3$, and $R_4$ may be the same functional group or functional groups different from one another, m and n each represent an integer of 0 or more, and the sum of m and n is an integer of 1 or more, the skeleton may be of a random copolymer or a block copolymer.

2. The organic semiconductor device according to claim 1, wherein the conductor of the organic semiconductor device comprises a gate electrode, a source electrode, and a drain electrode, the insulator comprises a gate insulating layer, and at least one compound constituting the gate insulating layer has the silsesquioxane skeleton of the Formula 1.

3. The organic semiconductor device according to claim 2, wherein the gate insulating layer has a thickness of 50 nm or more and 250 nm or less.

4. A method of manufacturing an organic semiconductor device, comprising the steps of: coating a substrate with a solution containing at least one of polyorganosilsesquioxane compounds of the Formula 2 and/or Formula 3; and drying the solution at a temperature of 200° C. or lower to form the insulator of the organic semiconductor device according to claim 1,

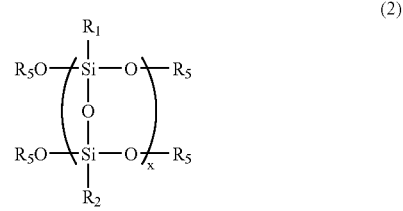

(2)

where $R_1$ and $R_2$ each represent one of a substituted or unsubstituted alkyl group having 1 to 5 carbon atoms and a substituted or unsubstituted phenyl group, and $R_1$ and $R_2$ may be the same functional group, $R_5$ represents one of an alkyl group having 1 to 4 carbon atoms and a hydrogen atom, and x is an integer of 1 or more,

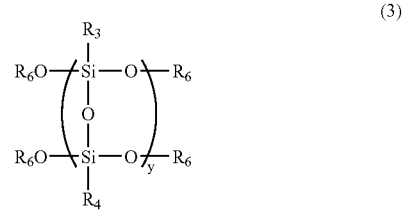

(3)

where $R_3$ and $R_4$ each represent one of a substituted or unsubstituted alkyl group having 1 to 5 carbon atoms and a substituted or unsubstituted phenyl group, and $R_3$ and $R_4$ may be the same functional group, $R_6$ represents one of an alkyl group having 1 to 4 carbon atoms and a hydrogen atom, and y is an integer of 1 or more.

5. The method of manufacturing an organic semiconductor device according to claim 4, wherein the solution containing the polyorganosilsesquioxane compound further contains formic acid.

6. The method of manufacturing an organic semiconductor device according to claim 4, wherein the gate insulator is formed by the coating step and drying step of a precursor solution.

7. The method of manufacturing an organic semiconductor device according to claim 4, wherein a refractive index of the gate insulator at a wavelength of 632 nm after the drying step is reduced by 0.015 or more from that before the drying step.

8. The organic semiconductor device according to claim 1, further comprising a substrate, a gate insulating layer, a gate electrode; a source electrode, a drain electrode, and an organic semiconductor layer, wherein the gate insulating layer contains a compound having a silsesquioxane skeleton of the Formula 1 and an inorganic compound particle which is dispersed into the compound and does not have ferroelectricity of a relative dielectric constant of 5 or more.

9. The organic semiconductor device according to claim 8, wherein the gate insulating layer has a thickness of 50 nm or more and 250 nm or less.

10. The method of manufacturing an organic semiconductor device, comprising the steps of: coating a substrate with a dispersion prepared by dispersing an inorganic compound particle having no ferroelectricity into a solution containing at least one of polyorganosilsesquioxane compounds of the Formula 2 and/or Formula 3; and drying the dispersion at a temperature of 200° C. or lower to form the gate insulating layer of the organic semiconductor device according to claim 8.

11. The method of manufacturing an organic semiconductor device according to claim 10, wherein the solution containing the polyorganosilsesquioxane compound further contains formic acid.

12. An organic semiconductor apparatus formed of the organic semiconductor device according to claim 1.

13. An organic semiconductor device comprising: a substrate, an organic semiconductor, a gate insulator, a gate electrode, a source electrode, and a drain electrode, wherein (1) at least one compound constituting the gate insulator has a silsesquioxane skeleton of the Formula 1;

(2) the gate insulator has a thickness of 50 nm or more and 250 nm or less;

(3) the gate insulator is formed by a coating step and a drying step of a precursor solution; and (4) the refractive index of the gate insulator at a wavelength of 632 nm after the drying step is reduced by 0.015 or more from that before the drying step,

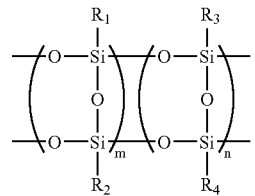

where $R_1$, $R_2$, $R_3$, and $R_4$ each represent one of a substituted or unsubstituted alkyl group having 1 to 5 carbon atoms and a substituted or unsubstituted phenyl group, and $R_1$, $R_2$, $R_3$, and $R_4$ may be the same functional group or functional groups different from one another, m and n each represent an integer of 0 or more, and the sum of m and n is an integer of 1 or more, the skeleton may be of a random copolymer or a block copolymer.

14. An organic semiconductor apparatus formed of the organic semiconductor device according to claim 13.

* * * * *

UNITED STATES PATENT AND TRADEMARK OFFICE
CERTIFICATE OF CORRECTION

| | |
|---|---|
| PATENT NO. | : 7,265,377 B2 |
| APPLICATION NO. | : 10/541495 |
| DATED | : September 4, 2007 |
| INVENTOR(S) | : Kubota et al. |

It is certified that error appears in the above-identified patent and that said Letters Patent is hereby corrected as shown below:

COLUMN 4:
Line 33, "semiconductor;" should read -- semiconductor, --.

COLUMN 6:
Line 7, "electrode;" should read -- electrode, --.

COLUMN 12:
Line 6, "cosideration" should read -- consideration --.

COLUMN 14:
Line 67, "an deposition" should read -- a deposition --.

COLUMN 17:
Line 60, "line (b)" should read -- line (b). --.

COLUMN 18:
Line 17, "form" should read -- from --; and
Line 41, "The" should begin a new paragraph.

COLUMN 20:
Line 53, "an deposition" should read -- a deposition --.

UNITED STATES PATENT AND TRADEMARK OFFICE
CERTIFICATE OF CORRECTION

PATENT NO. : 7,265,377 B2
APPLICATION NO. : 11/541495
DATED : September 4, 2007
INVENTOR(S) : Kubota et al.

It is certified that error appears in the above-identified patent and that said Letters Patent is hereby corrected as shown below:

COLUMN 21:
Line 25, "insulator;" should read -- insulator, --.

COLUMN 22:
Line 53, "electrode;" should read -- electrode, --.

Signed and Sealed this

Sixth Day of May, 2008

JON W. DUDAS
*Director of the United States Patent and Trademark Office*